United States Patent
Watanabe et al.

(10) Patent No.: US 7,385,870 B2
(45) Date of Patent: Jun. 10, 2008

(54) SEMICONDUCTOR MEMORY DEVICE AND SEMICONDUCTOR INTEGRATED CIRCUIT DEVICE

(75) Inventors: Noriyoshi Watanabe, Chitose (JP); Noriaki Maeda, Fussa (JP); Masanao Yamaoka, Hachioji (JP); Yoshihiro Shinozaki, Fukuoka (JP)

(73) Assignees: Renesas Technology Corp., Tokyo (JP); SuperH, Inc., San Jose, CA (US); Renesas Northern Japan Semiconductor, Inc., Hokkaido (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/812,596

(22) Filed: Jun. 20, 2007

(65) Prior Publication Data

US 2007/0247952 A1 Oct. 25, 2007

Related U.S. Application Data

(63) Continuation of application No. 11/353,967, filed on Feb. 15, 2006, now Pat. No. 7,251,182, which is a continuation of application No. 10/927,052, filed on Aug. 27, 2004, now Pat. No. 7,031,220.

(30) Foreign Application Priority Data

Aug. 28, 2003 (JP) ............................. 2003-304013

(51) Int. Cl.
*G11C 5/14* (2006.01)
(52) U.S. Cl. ...................... 365/226; 365/227; 365/229; 713/324
(58) Field of Classification Search ................. 713/324
See application file for complete search history.

(56) References Cited

U.S. PATENT DOCUMENTS

| | | | |
|---|---|---|---|
| 4,151,611 A | 4/1979 | Sugawara et al. | |
| 4,617,650 A | 10/1986 | Morino et al. | |
| 5,490,118 A | 2/1996 | Nishioka et al. | |
| 5,761,144 A | 6/1998 | Fukuzumi | |
| 5,774,405 A | 6/1998 | Tomishima | |
| 5,832,226 A * | 11/1998 | Suzuki et al. ............... | 709/223 |
| 5,858,779 A | 1/1999 | Iwane et al. | |
| 5,901,103 A | 5/1999 | Harris, II et al. | |
| 6,031,780 A | 2/2000 | Abe | |
| 6,038,189 A | 3/2000 | Morishita | |
| 6,366,510 B2 | 4/2002 | Fibranz | |
| 6,426,908 B1 | 7/2002 | Hidaka | |
| 6,930,948 B2 | 8/2005 | Lee et al. | |
| 7,031,220 B2 | 4/2006 | Watanabe et al. | |
| 2002/0120811 A1 | 8/2002 | Maeda | |

\* cited by examiner

*Primary Examiner*—Tan T. Nguyen
(74) *Attorney, Agent, or Firm*—Miles & Stockbridge, P.C.

(57) ABSTRACT

A leakage current of the MOS transistor of a power control section at a standby time is drastically reduced and the reduction of the consumption power is achieved. A memory module is provided with power control sections. When either of the memory mats is not selected, the power control sections stop the power supply voltage to a non-selected memory mat, a word driver, an input-output circuit, a control circuit and an output circuit. At the standby time of the memory module, the power control section stops a power supply to power control sections, a control circuit, a predecoder circuit, and an input circuit. In this manner, the leakage current of the MOS transistor of the power control sections at the standby time can be drastically reduced.

4 Claims, 7 Drawing Sheets

SEMICONDUCTOR MEMORY DEVICE AND SEMICONDUCTOR INTEGRATED CIRCUIT DEVICE

CROSS-REFERENCE TO RELATED APPLICATION

This application is a continuation of application Ser. No. 11/353,967 filed Feb. 15, 2006 now U.S. Pat. No. 7,251,182, which is a continuation of application Ser. No. 10/927,052 filed Aug. 27, 2004, now U.S. Pat. No. 7,031,220 issued Apr. 18, 2006.

The present application claims priority from Japanese Patent Application No. JP2003-304013 filed on Aug. 28, 2003, the content of which is hereby incorporated by reference into this application.

TECHNICAL FIELD OF THE INVENTION

The present invention relates to a technique for reducing power consumption in a semiconductor integrated circuit device, and more in particular, it relates to a technique which is effective when applied to the reduction of a leakage current at a standby time in a semiconductor memory such as an SRAM (Static Random Access Memory) and the like.

BACKGROUND OF THE INVENTION

In general, a memory module such as the SRAM is contained in a semiconductor integrated circuit device such as a system LSI.

Some of these memory modules mentioned above are provided with a power control section for reducing power consumption by cutting off the power during a period when a circuit operation is not needed. This power control section is provided, for example, in each divided memory mat.

The power control section consists of a memory mat, an input-output circuit, a control circuit, a plurality of MOS (Metal Oxide Semiconductor) transistors provided between the power supply voltages supplied to peripheral circuits such as a word driver, a predecoder circuit and the like, and a power control circuit for controlling the on and off of these MOS transistors.

The power control circuit cuts off the power supply voltage supplied to the memory mat, the input-output circuit, and the peripheral circuits by turning off the MOS transistors at the standby time of the semiconductor integrated circuit device.

SUMMARY OF THE INVENTION

However, the inventors of the present invention have found out that the above-described technique for reducing the consumption power in the semiconductor integrated circuit device has the following problem.

That is, with the increase of the capacity of the memory module and the increase of the number of the divided memory mats, the number of MOS transistors of the power control section tends to increase, and a standby current of the semiconductor integrated circuit device becomes large due to the increase of a subthreshold current in the MOS transistors.

An object of the present invention is to provide a semiconductor memory device and a semiconductor integrated circuit device capable of reducing the power consumption by drastically reducing the leakage current of the MOS transistors at a standby time.

The above and other objects and novel characteristics of the present invention will be apparent from the description of this specification and the accompanying drawings.

The typical one of the inventions disclosed in this application will be briefly described as follows.

The semiconductor memory device according to the present invention comprises: memory mats obtained by dividing a memory array into at least two portions; a first peripheral circuit which is provided for each of the respective memory mats, controls the memory mats, and performs a data transfer with the memory mat; a second peripheral circuit for performing overall control of each of the peripheral circuits; a first power control section for controlling a power supply in a non-selected first peripheral circuit when one of the memory mats divided into at least two portions is selected and operated; and a second power control section for controlling a power supply in the first power control section and the second peripheral circuit when either of the memory mat divided into at least two portions is not selected.

Also, the semiconductor integrated circuit device according to the present invention comprises: a memory module which includes: memory mats obtained by dividing a memory array into at least two portions; a first peripheral circuit which is provided for each of the respective memory mats, controls the memory mats, and performs a data transfer with the memory mat; a second peripheral circuit for performing overall control of each of the peripheral circuits; a first power control section for controlling a power supply in a non-selected first peripheral circuit when one of the memory mats divided into at least two portions is selected and operated; and a second power control section for controlling a power supply in the first power control section and the second peripheral circuit when either of the memory mats divided into at least two portions is not selected.

The effects obtained by the representative one of the inventions disclosed in this application will be briefly described as follows.

1. It is possible to drastically reduce the consumption current at a standby time by cutting off the power supply at a standby time in a first power control section.

2. It is also possible to further drastically reduce the consumption current at a standby time since the power supply to first and second peripheral circuits at a standby time can be reliably cut off.

3. Since it is possible to reduce the consumption current of the semiconductor memory device and the semiconductor integrated circuit device by the above 1 and 2, the performance and the reliability of an electronic system formed by using these semiconductor memory device and semiconductor integrated-circuit device can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

Figure 1:
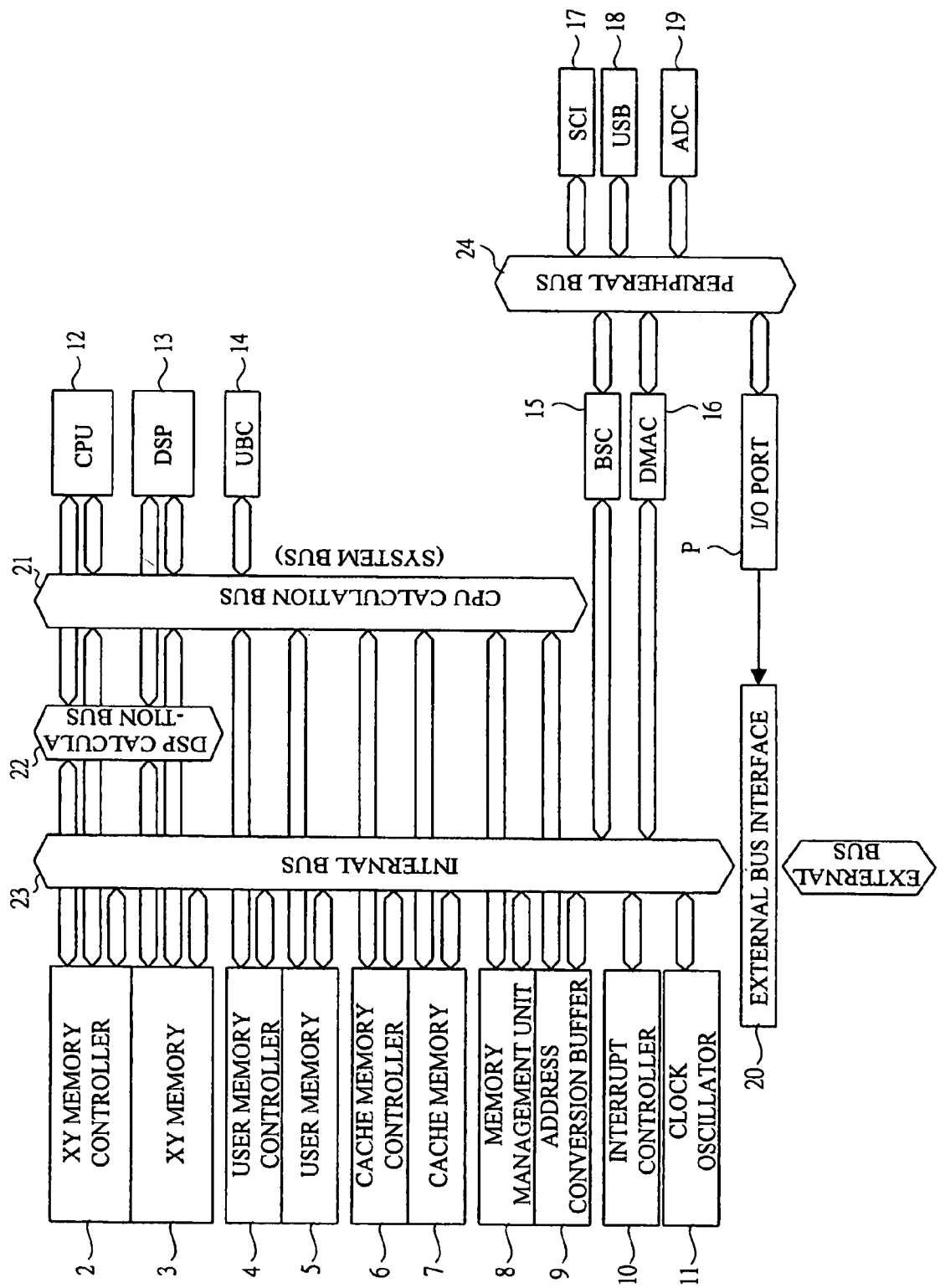
FIG. 1 is a block diagram of a semiconductor integrated circuit device according to a first embodiment of the present invention.
Figure 2:
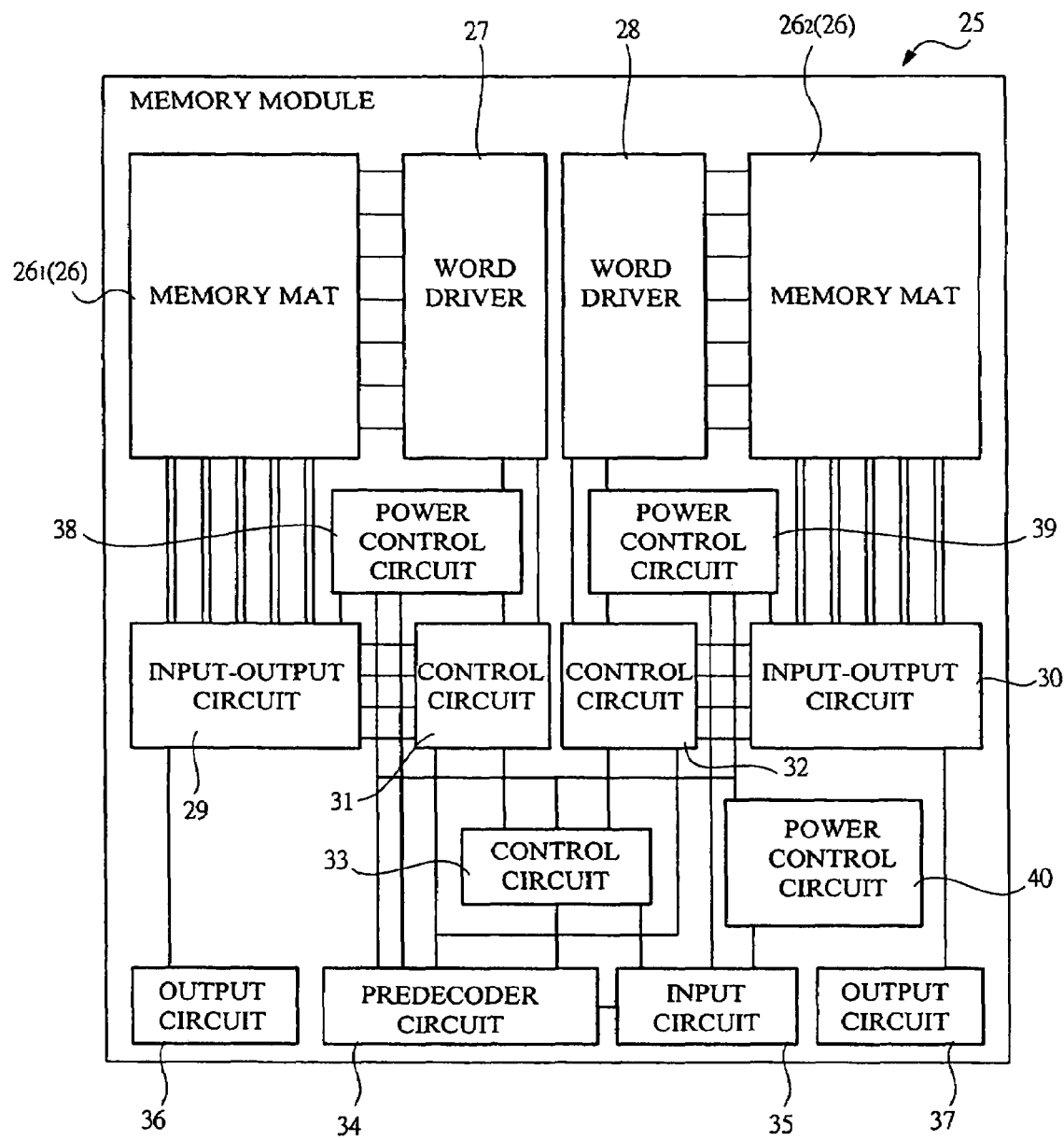
FIG. 2 is a block diagram of a memory module provided in the semiconductor integrated circuit device of FIG. 1.
Figure 3:
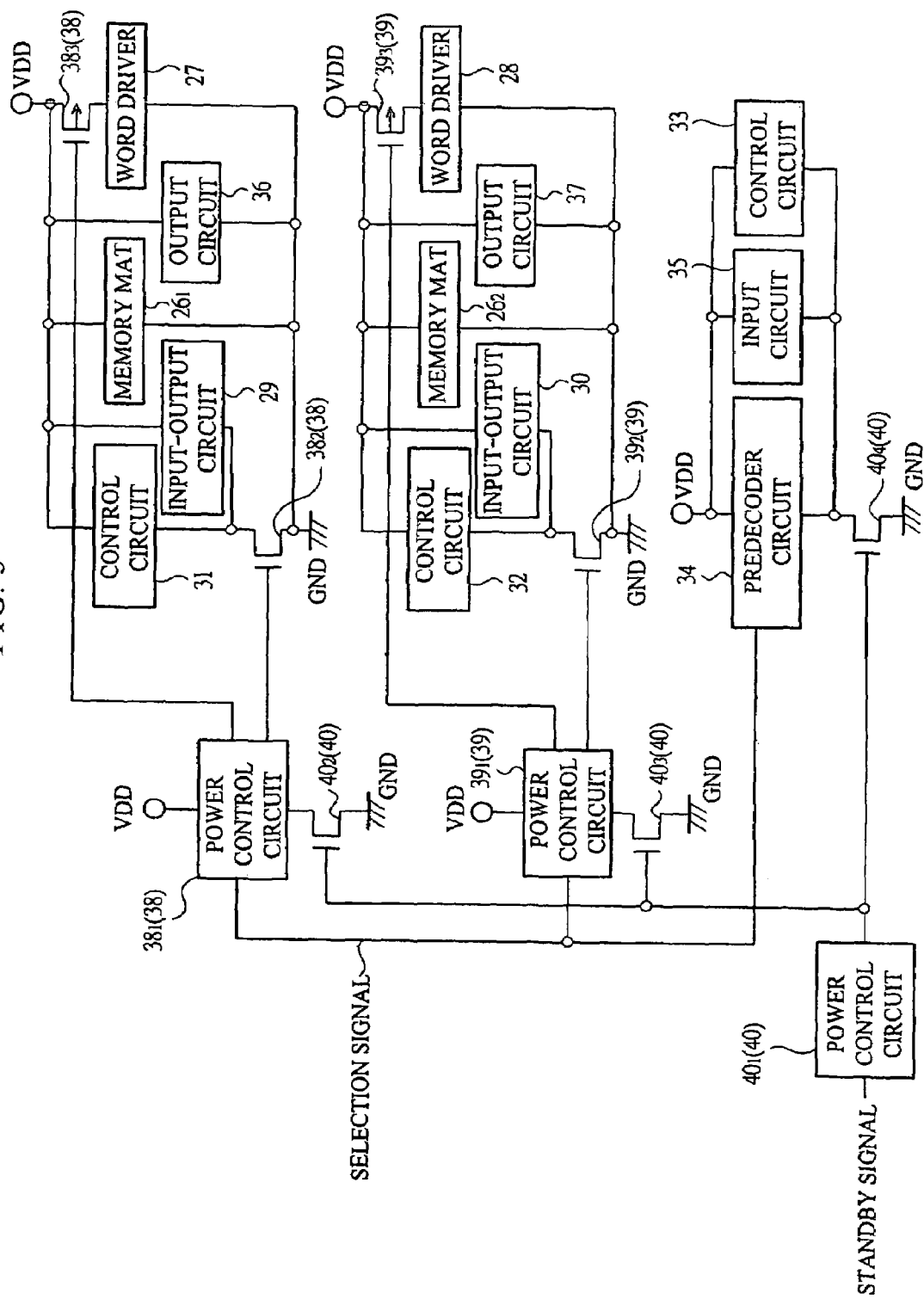
FIG. 3 is a circuit diagram showing a connection configuration in a power control section provided in the memory module of FIG. 2.
Figure 4:
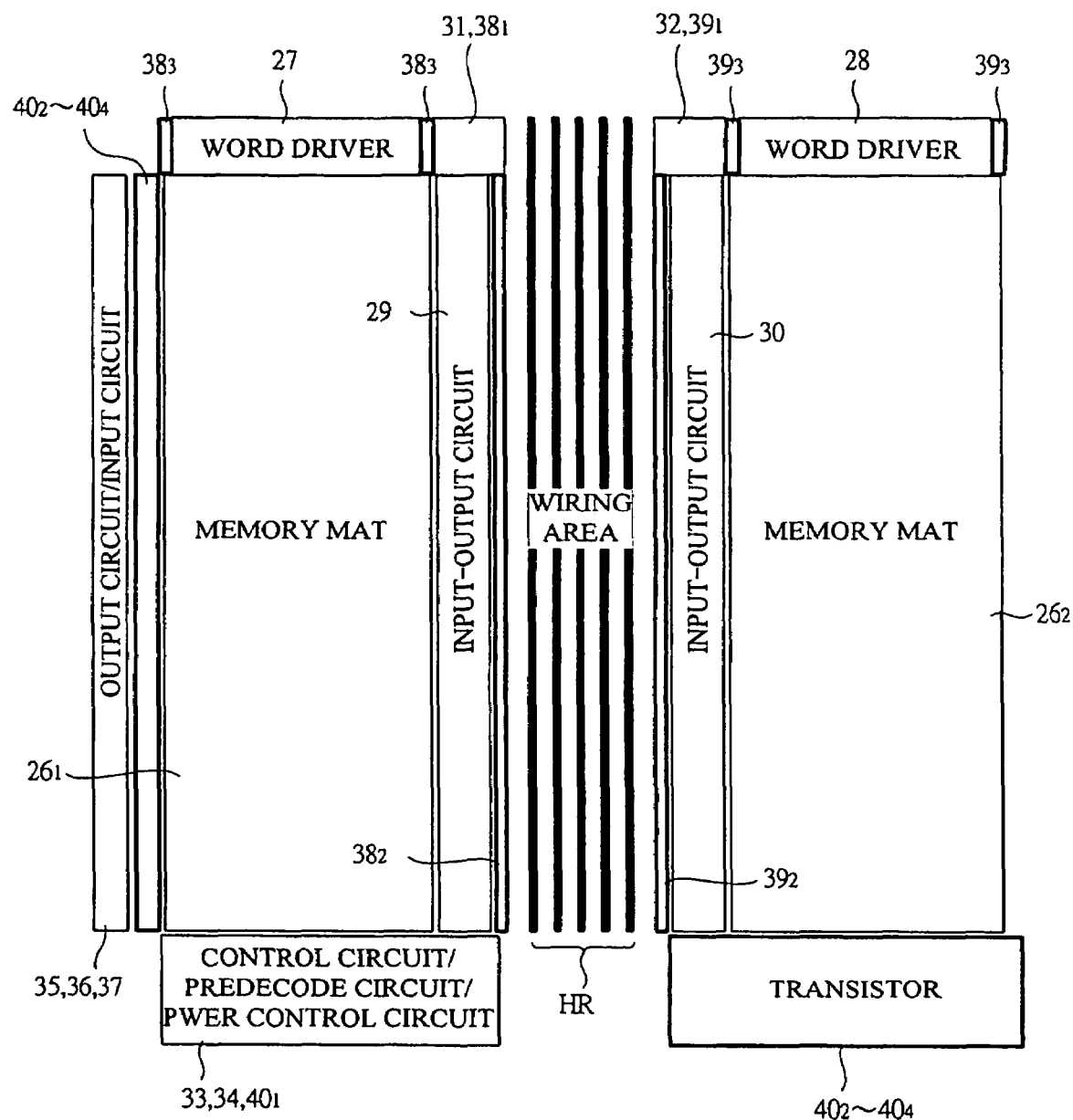
FIG. 4 is a chip layout view in the power control section of FIG. 3.

FIG. 1 is a block diagram of a semiconductor integrated circuit device according to the first embodiment of the present invention, FIG. 2 is a block diagram of a memory module provided in the semiconductor integrated circuit device of FIG. 1, FIG. 3 is a circuit diagram showing a connection configuration in a power control section provided in the memory module of FIG. 2, and FIG. 4 is a chip layout diagram in the power control section of FIG. 3.

In this first embodiment, the semiconductor integrated circuit device 1 is a microcomputer for processing various multimedia applications used in the electronic system such as a mobile phone and the like.

As shown in FIG. 1, the semiconductor integrated circuit device 1 is composed of an XY memory controller 2, an XY memory 3, a user memory controller 4, a user memory 5, a cache memory controller 6, a cache memory 7, a memory management unit 8, an address conversion buffer 9, an interrupt controller 10, a clock oscillator 11, a CPU (Central Processing Unit) 12, a DSP (Digital Signal Processor) 13, a UBC (User Break Controller) 14, a BSC (Bus State Controller) 15, a DMAC (Direct Memory Access Controller) 16, an SCI (Serious Communication Interface) 17, a USB (Universal Serial Bus) 18, an A/D converter 19, an external bus interface 20, and the like.

The XY memory controller 2, the XY memory 3, the user memory controller 4, the user memory 5, the cache memory controller 6, the cache memory 7, the memory management unit 8, the address conversion buffer 9, the CPU 12, the DSP 13, and the user break controller 14 are mutually connected to one another via a CPU calculation bus (a system bus, a first bus) 21.

Further, the XY memory controller 2, the XY memory 3, the CPU 12, and the DSP 13 are mutually connected to one another via a DSP calculation bus (first bus) 22, and these elements can be accessed in parallel, for example, at a width of 16 bit by the DSP calculation bus 22.

Further, the XY memory controller 2, the XY memory 3, the user memory controller 4, the user memory 5, the cache memory controller 6, the cache memory 7, the memory management unit 8, the address conversion buffer 9, the interrupt controller 10, the clock oscillator 11, the bus state controller 15, the DMAC 16, and the external bus interface 20 are mutually connected to one another via an internal bus (second bus) 23.

The bus state controller 15, the DMAC 16, the SCI 17, the USB 18, the A/D converter 19, and an I/O port P are mutually connected to one another via a peripheral bus (third bus) 24.

The XY memory controller 2 controls the XY memory 3 upon receipt of an access request from the CPU 12, the DSP 13, and the DMAC 16. The XY memory 3 is accessible from the CPU 12, the DSP 13 and the DMAC 16 and stores a command, a data and the like.

The user memory controller 4 controls the user memory 5 upon receipt of the access request from the CPU 12 and the DMAC 16. The user memory 5 is a memory directly accessible from the CPU 12.

The cache memory controller 6 controls the cache memory 7 upon receipt of the access from the CPU 12. The cache memory 7 performs read/write of the data, the command, and the like.

The memory management unit 8 performs a mapping of a virtual memory and a physical memory. The address conversion buffer 9 stores address conversion information from the virtual memory to the physical memory.

The interrupt controller 10 determines the priority of interrupt factors and controls the interrupt into the CPU 12. The clock oscillator 11 generates a clock to be supplied to each module of the semiconductor integrated circuit device 1.

The CPU 12 performs various kinds of calculation processing based on the programs. The DSP 13 is a processor dedicated to the processing of a digital signal, and for example, it processes images and sounds in real time. The UBC 14 sets the various break conditions when debugging the programs.

The BSC 15 divides the physical address space and controls an external memory and a bus state interface.

The DMAC 16 performs a data transfer between the external memory and an internal peripheral module at high speed in place of the CPU 12. The SCI 17 is an interface for performing the serial communication. The USB 18 is an interface for performing the USB transfer. The A/D converter 19 converts an analog signal into a digital signal. The external bus interface 20 is an interface with an external bus in the semiconductor integrated circuit device 1.

Further, the XY memory 3, the user memory 5, the cache memory 7, and the address conversion buffer 9 are composed of a memory module 25 consisting of the SRAM and the like.

FIG. 2 is a block diagram showing the configuration of the memory module 25.

The memory module 25 has a memory array 26 in which memory cells which are the smallest unit of memory are regularly arranged in an array. This memory array 26 has, for example, a dual architecture provided with two memory mats $26_1$ and $26_2$.

The memory mat $26_1$ and the memory mat $26_2$ are connected to word drivers (first peripheral circuits) 27 and 27, respectively. These word drivers 27 and 28 select word lines in a row direction in the memory mat $26_1$ and the memory mat $26_2$.

Further, the memory mat $26_1$ and the memory mat $26_2$ are connected to input-output circuits (first peripheral circuits) 29 and 30, respectively. The input-output circuits 29 and 30 control an input-output timing of the data in the memory mats $26_1$ and $26_2$.

The input-output circuits 29 and 30 are connected to control circuits (first peripheral circuits) 31 and 32, respectively. The control circuit 31 is connected to the word driver 27 and the control circuit (second peripheral circuit) 33, respectively, and the control circuit 32 is connected to the word driver 28 and the control circuit 33, respectively.

Further, the control circuits 31 to 33 are connected to a predecoder circuit (second peripheral circuit) 34, and the predecoder circuit 34 is connected to an input circuit (second peripheral circuit) 35. The input-output circuits 29 and 30 are connected to output circuits 36 and 37, respectively.

Address and various types of command signals are inputted from the input circuit 35. The predecoder circuit 34 predecodes the address inputted via the input circuit 35 and outputs the same to the control circuits 31 to 33.

The control circuit 33 performs the overall control in the memory module 25 and selects either of the control circuits 31 or 32 based on the inputted address and command signals, and at the same time, outputs a control signal obtained by decoding the command signal. The control circuits 31 and 32 supply the predecode signal to the word drivers 27 and 28 based on the control signal outputted from the control circuit 33.

Further, the word driver 27, the input-output circuit 29, and the control circuit 31 are connected to a power control section (first power control section) 38, respectively, and the word driver 28, the input-output circuit 30, and the control circuit 32 are connected to a power control section (first power control section) 39, respectively.

The power control section 38 stops the power supply voltage to the word driver 27, the input-output circuit 29, and the control circuit 31 when the memory mat $26_1$ is not selected.

The power control section 39 stops the power supply voltage to the word driver 28, the input-output circuit 30, and the control circuit 32 when the memory mat $26_2$ is not selected.

Further, the control circuit 33, the predecoder circuit 34, the input circuit 35, and the power control sections 38 and 39 are connected to a power control section (second power control section) 40, respectively. The power control section 40 stops the power supply voltage to the control circuit 33, the predecoder circuit 34, the input circuit 35, and the power control sections 38 and 39 when both the memory mats $26_1$ and $26_2$ are not selected.

FIG. 3 is an explanatory diagram of the circuit configuration of the power control sections 38 to 40.

The power control section 38 is composed of a power control circuit (first switch control circuit) $38_1$, and transistors (first switch section) $38_2$ and $38_3$. The transistor $38_2$ consists of an N channel MOS, and the transistor $38_3$ consists of a P channel MOS.

The input-output circuit 29 and the control circuit 31 are connected between the power supplies via the transistor $38_2$, and the word driver 27 is connected between the power supplies via the transistor $38_3$. The memory mat $26_1$ and the output circuit 36 are directly connected between the power supplies.

The transistor $38_2$ is connected between the input-output circuit 29 and a reference potential GND and between the control circuit 31 and the reference potential GND. Also, the transistor $38_3$ is connected between the word driver 27 and a power supply voltage VDD.

The power control circuit $38_1$ controls the on and off of the transistors $38_2$ and $38_3$ based on a selection signal (for example, a high-order address of the addresses to be inputted from the CPU 12) for selecting the memory mat outputted from the predecoder circuit 34.

The power control section 39 is composed of a power control circuit (first switch control circuit) $39_1$ and transistors (first switch sections) $39_2$ and $39_3$. The transistor $39_2$ consists of the N channel MOS and the transistor $39_3$ consists of the P channel MOS.

The input-output circuit 30 and the control circuit 32 are connected between the power supplies via the transistor $39_2$, and the word driver 28 is connected between the power supplies via the transistor $39_3$. The memory mat $26_2$ and the output circuit 37 are directly connected between the power supplies.

The transistor $39_2$ is connected between the input-output circuit 30 and the reference potential GND and between the control circuit 32 and the reference potential GND, and the transistor $39_3$ is connected between the word driver 28 and the power supply voltage VDD.

The power control circuit $39_1$ controls the on and off of the transistors $39_2$ and $39_3$ based on the memory mat selection signal outputted from the predecoder circuit 34.

When the transistors $39_2$ and $39_3$ are turned off, connections between the input-output circuit 30 and the reference potential GND and between the control circuit 32 and the reference potential GND, and between the power supply voltage VDD and the word driver 28 are shut off, and the power supply is stopped.

Here, the reason why the power supply to the memory mats $26_1$ and $26_2$ is not stopped is to hold the data of the memory mats $26_1$ and $26_2$, and the reason why the power supply to the output circuits 36 and 37 is not stopped is to prevent the output of the memory module 25 from becoming a high impedance.

Further, since the word drivers 27 and 28 output Hi signals at an active time, the power supply voltage VDD is shut off and the reference potential GND is connected by the word drives 27 and 28. By doing so, it is possible to prevent the malfunction of the memory mats $26_1$ and $26_2$.

The power control section (second power control section) 40 is composed of a power control circuit (second switch control circuit) $40_1$ and transistors (second switch sections) $40_2$ to $40_4$. The transistors $40_2$ to $40_4$ are composed of the N channel MOS.

The transistor $40_2$ is connected between the power control circuit $38_1$ and the reference potential GND, and the transistor $40_3$ is connected between the power control circuit $38_2$ and the reference potential GND. The transistor $40_4$ is connected between the predecoder circuit 34, the input circuit 35, and the control circuit 33 and the reference potential GND.

The power control circuit $40_1$ controls the on and off of the transistors $40_2$ to $40_4$ based on a standby signal inputted externally from the CPU 12 (FIG. 1) and the like. When the standby signal is inputted to the power control circuit $40_1$, the power control circuit $40_1$ outputs a Lo signal and turns off the transistors $40_2$ to $40_4$.

Next, the operation of the power control sections 38 to 40 in the first embodiment will be described.

During the time when a memory mat selection signal outputted from the predecoder circuit 34 selects the memory mat $26_1$, the power control circuit $38_1$ outputs a control signal to turn on the transistors $38_2$ and $38_3$, and the power control circuit $39_1$ outputs a control signal to turn off the transistors $39_2$ and $39_3$. In this manner, the power supply to the word driver 28, the input-output circuit 30, and the control circuit 32, operations of which are not needed is shut off.

Further when the standby signal is inputted and the memory module 25 is put into a standby state, the power control circuit $40_1$ outputs a Lo signal to turn off the transistors $40_2$ to $40_4$. Therefore, not only the power supply to the control circuit 33, the predecoder circuit 34 and the input circuit 35 but also the power sup-ply to the power control circuits $38_1$ and $39_1$ are shut off, and the leakage current and the like of the MOS transistors which form the power control circuits $38_1$ and $39_1$ can be drastically reduced.

FIG. 4 is an explanatory drawing of the layout of the power control sections 38 to 40 in a semiconductor chip CH.

As shown in FIG. 4, a wiring area HR in which wiring patterns are formed is provided in the central region. An input-out circuit 29 extending from above to below is formed on the left side of the wiring area HR, and an input-output circuit 30 extending from above to below is formed on the right side of the wiring area HR.

The memory mat $26_1$ is formed on the left side of the input-output circuit 29 and the memory mat $26_2$ is formed on the right side of the input-output circuit 30.

The power control circuit $38_1$ and the control circuit 31 are formed above the input-output circuit 29 and the power control circuit $39_1$ and the control circuit 32 are formed above the input-output circuit 30.

The word drivers 27 and 28 are formed above the memory mats $26_1$ and $26_2$. The transistors $38_3$ and $39_3$ are formed on the left and right of the word drivers 27 and 28. These transistors $38_3$ and $39_3$ are composed of a large number of transistors connected in parallel.

The transistors $40_2$ to $40_4$ are formed on the left side of the memory mat $26_1$ and the input circuit 35 and the output circuits 36 and 37 are formed on the left side of the area where the transistors $40_2$ to $40_4$ are formed.

The control circuit 33, the predecoder circuit 34, and the power control circuit $40_1$ are formed below the memory mat $26_1$. The transistors $40_2$ to $40_4$ are formed below the memory mat $26_2$. These transistors $40_2$ to $40_4$ are also composed of a large number of transistors connected in parallel.

The transistor $38_2$ is formed on the right side of the input-output circuit 29 and the transistor $39_2$ is formed on the left side of the input-output circuit 30. These transistors $38_2$ and $39_2$ are also composed of a large number of transistors connected in parallel.

In this manner, according to this first embodiment, since the power supply to the power control circuits $38_1$ and $39_1$ is also shut off at the standby time of the memory module 25, the current at the standby time in the memory module 25 can be drastically reduced.

Second Embodiment

Figure 5:
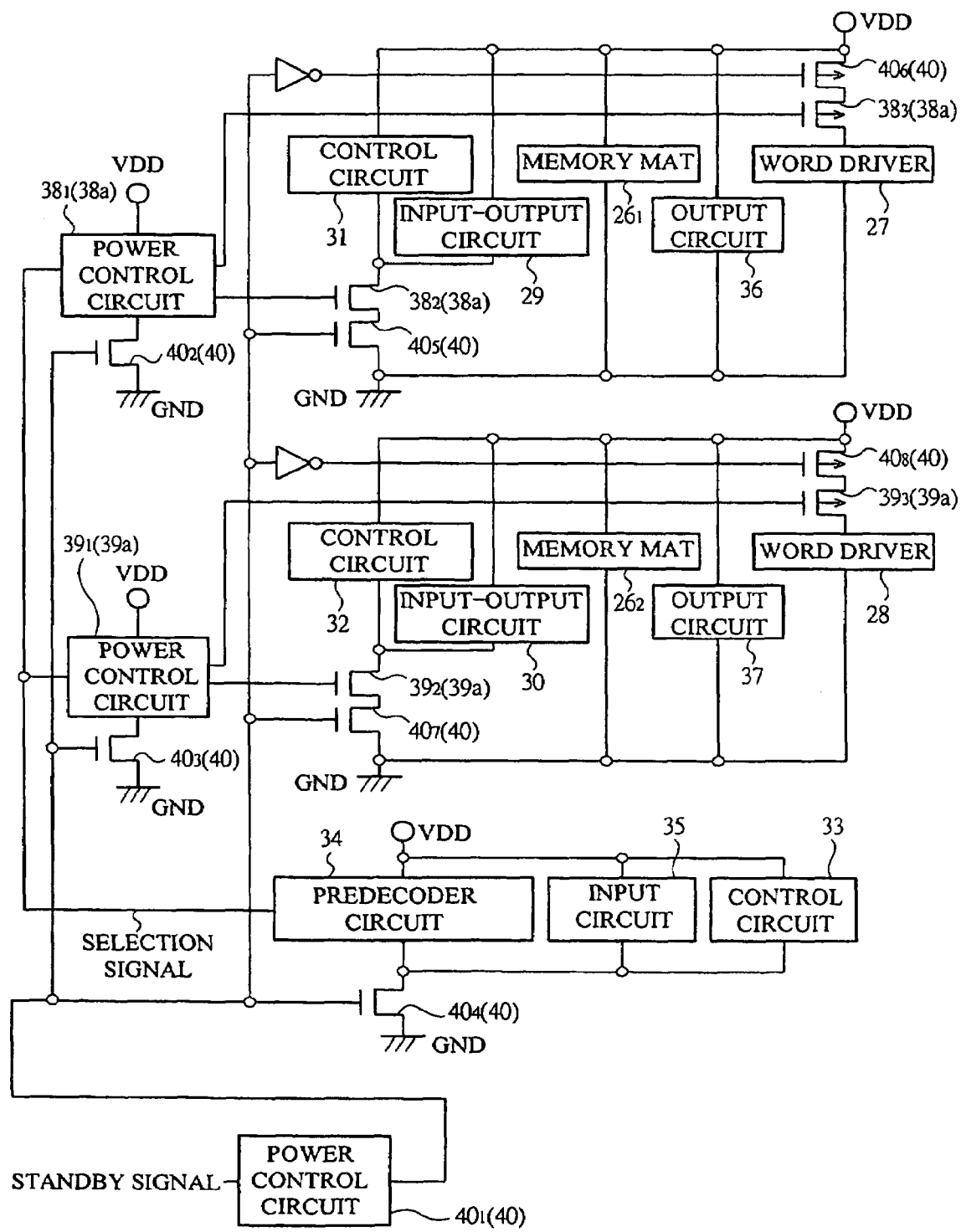
FIG. 5 is a circuit diagram showing the connection configuration of the power control section provided in the memory module according to a second embodiment of the present invention.

FIG. 5 is a circuit diagram showing a connection configuration of a power control section provided in a memory module according to a second embodiment of the present invention.

In this second embodiment, similar to the memory module 25 (FIG. 2) of the first embodiment, a memory module 25a is composed of a memory array 26 consisting of a memory mat $26_1$ and a memory mat $26_2$, word drivers 27 and 28, input-output circuits 29 and 30, control circuits 31 to 33, the predecoder circuit 34, the input circuit 35, output circuits 36 and 37, power control sections 38a and 39a (first power control sections), and a power control section 40.

As shown in FIG. 5, the power control section 40 is different in that transistors $40_5$, $40_6$, $40_7$ and $40_8$ (second switch sections) are provided to the same configuration as the first embodiment (FIG. 3) composed of the power control circuit $40_1$ and the transistors $40_2$, $40_3$ and $40_4$.

The transistor $40_5$ is connected between the control circuit 31 and a reference potential GND and between the input-output circuit 29 and the reference potential GND, and the transistor $40_6$ is connected between the word driver 27 and the power supply voltage VDD.

The transistor $40_7$ is connected between the control circuit 32 and the reference potential GND and between the input-output circuit 30 and the reference potential GND, and the transistor $40_8$ is connected between the word driver 28 and the power supply voltage VDD.

Further, since other circuit connection configuration is identical to that in FIG. 3 of the first embodiment, the description thereof will be omitted.

Next, the operation of the power control sections 38a and 39a in the second embodiment will be described.

During the time when a selection signal outputted from the predecoder circuit 34 selects the memory mat $26_1$, a Hi signal is outputted to the transistor $38_2$ from the output section of the power control circuit $38_1$, and a Lo signal is outputted to the transistor $39_2$ from the output section of the power control circuit $39_1$.

At this time, since a standby signal is not inputted to the power control circuit $40_1$, the Hi signal is outputted so as to turn on the transistors $40_2$ to $40_5$, and the Lo signal is inputted through an inverter to the transistor $40_6$ so as to turn on the transistor $40_6$.

Consequently, the transistors $38_2$, $38_3$, $40_5$, and $40_6$ are turned on and the transistors $39_2$ and $39_3$ are turned off, and thus, the power supply to the word driver 28, the input-output circuit 30, and the control circuit 32 is shut off.

Further, when the standby signal is inputted to the memory module 25a, the Lo signal is outputted from the power control circuit $40_1$ to turn off and the transistors $40_2$ to $40_5$ and $40_7$, and the Hi signal is inputted via the inverter to turn off the transistors $40_6$ and $40_8$.

When the transistors $40_2$ and $40_3$ are turned off, the power is not supplied to the power control circuits $38_1$ and $39_1$, and the output signal from the power control circuits $38_1$ and $39_1$ becomes uncertain. However, as described above, since the transistors $40_5$ to $40_8$ are turned off by the signal from the power control circuit $40_1$, it is possible to shut off the power supply to the power control circuits $38_1$ and $39_1$, the word drivers 27 and 28, the input-output circuits 29 and 30, and the control circuits 31 and 32.

Thus, in this second embodiment, even if the power supply to the power control circuits $38_1$ and $39_1$ is stopped, it is possible to turn off the transistors $40_5$, $40_6$, $40_7$ and $40_8$ so as to reduce the consumption current of the memory module 25a at the standby time.

Third Embodiment

Figure 6:
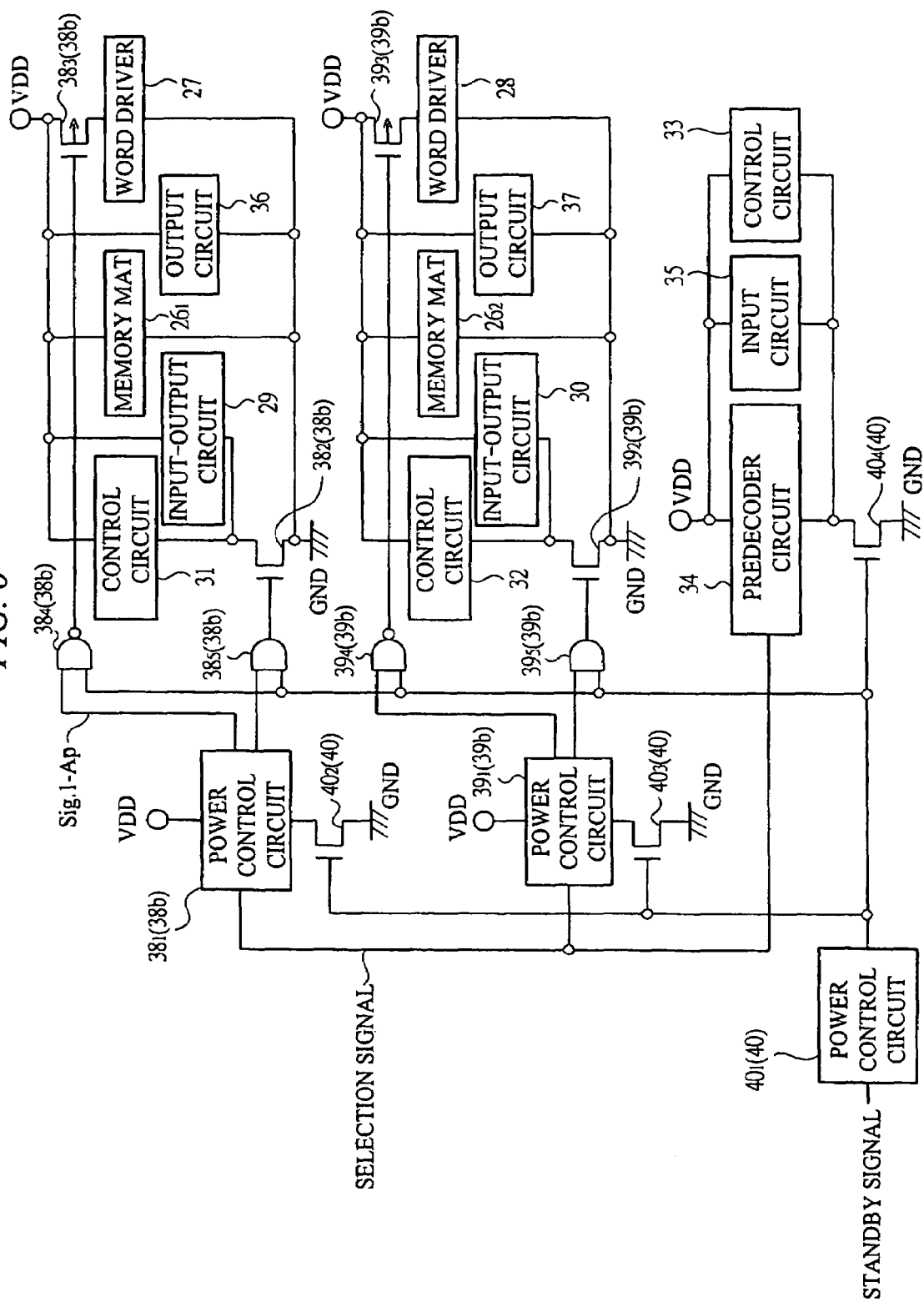
FIG. 6 is a circuit diagram showing the connection configuration of the power control section provided in the memory module according to a third embodiment of the present invention.

FIG. 6 is a circuit diagram showing a connection configuration of a power control section provided in a memory module according to the third embodiment of the present invention.

In this third second embodiment, similar to the memory module 25 (FIG. 2) of the first embodiment, a memory module 25b is composed of a memory array 26 consisting of a memory mat $26_1$ and a memory mat $26_2$, word drivers 27 and 28, input-output circuits 29 and 30, control circuits 31 to 33, a predecoder circuit 34, an input circuit 35, output circuits 36 and 37, power control sections 38b and 39a (first power control sections), and a power control section 40.

Further, as shown in FIG. 6, the power control sections 38a and 39a are different in that the NAND circuits (switch control sections) $38_4$ and $39_4$ and AND circuits (switch control sections) $38_5$ and $39_5$ are provided to the same configuration as the first embodiment (FIG. 3) composed of the power control circuits $38_1$ and $39_1$ and the transistors $38_2$, $38_3$, $39_2$ and $39_3$.

The output section of the power control circuit $38_1$ is connected to each one of the input sections of the NAND circuits $38_4$ and $38_5$, respectively, and the output section of the power control circuit $38_2$ is connected to each one of the input sections of the NAND circuit $39_4$ and the AND circuit $39_5$, respectively.

The output section of the power control circuit $40_1$ the output section of the power control circuit $40_1$ is connected to the output section of the power control circuit $40_1$, respectively. The gate of the transistor $38_3$ is connected to the output section of the NAND circuit $38_4$, and the gate of the transistor $38_2$ is connected to the output section of the AND circuit $38_5$.

The gate of the transistor $39_3$ is connected to the output section of the NAND circuit $39_4$, and the gate of the transistor $39_2$ is connected to the output section of the AND circuit $39_5$. Further, since the other circuit connection configuration is identical to that in FIG. 3 of the first embodiment, the description thereof will be omitted.

Next, the operation of the power control sections 38b and 39b in the third embodiment will be described.

During the time when a selection signal outputted from the predecoder circuit 34 selects the memory mat $26_1$, a Hi signal is outputted to the each one of the other input sections of the NAND circuit $38_4$ and the AND circuit $38_5$ from the output section of a power control circuit $39_1$. On the other hand, a Lo signal is outputted to each one of the input sections of the NAND circuit $39_4$ and the AND circuit $39_5$ from the output section of the power control circuit $38_1$.

At this time, since a standby signal is not inputted to the power control circuit $40_1$, the Hi signal is outputted so as to turn on the transistors $40_1$ to $40_4$, and the Hi signal is inputted to the other input sections of the NAND circuits $38_4$ and $39_4$ and the AND circuits $38_5$ and $39_5$, respectively.

Consequently, the transistors $38_2$ and $38_3$ are turned on and the transistors $39_2$ and $39_3$ are turned off, and thus, the power supply to the word driver 28, the input-output circuit 30 and the control circuit 32 is shut off.

Further, when the standby signal is inputted to the memory module 25a, the Lo signal is outputted from the power control circuit $40_1$ to turn off the transistors $40_2$ to $40_4$. The Lo signal is inputted to the other input sections of the NAND circuits $38_4$ and $39_4$ and the AND circuits $38_5$ and $39_5$, respectively.

When the transistors $40_2$ and $40_3$ are turned off, the power is not supplied to the power control circuits $38_1$ and $39_1$, and the output signal from the power control circuits $38_1$, and $39_1$ becomes uncertain. However, as described above, since the Lo signal is inputted to the other input sections of the NAND circuits $38_4$ and $39_4$ and the AND circuits $38_5$ and $39_5$, respectively, the NAND circuits $38_4$ and $39_4$ output the Hi signal and the AND circuits $38_5$ and $39_5$ output the Lo signal, and thus, the transistors $38_2$, $38_3$, $39_2$ and $39_3$ can be reliably turned off.

Consequently, in this third embodiment, even if the power supply to the power control circuits $38_1$ and $39_1$ is stopped, it is possible to reliably turn off the transistors $38_2$, $38_3$, $39_2$ and $39_3$ and also possible to further reduce the consumption current of the memory module 25b at the standby time.

Fourth Embodiment

Figure 7:
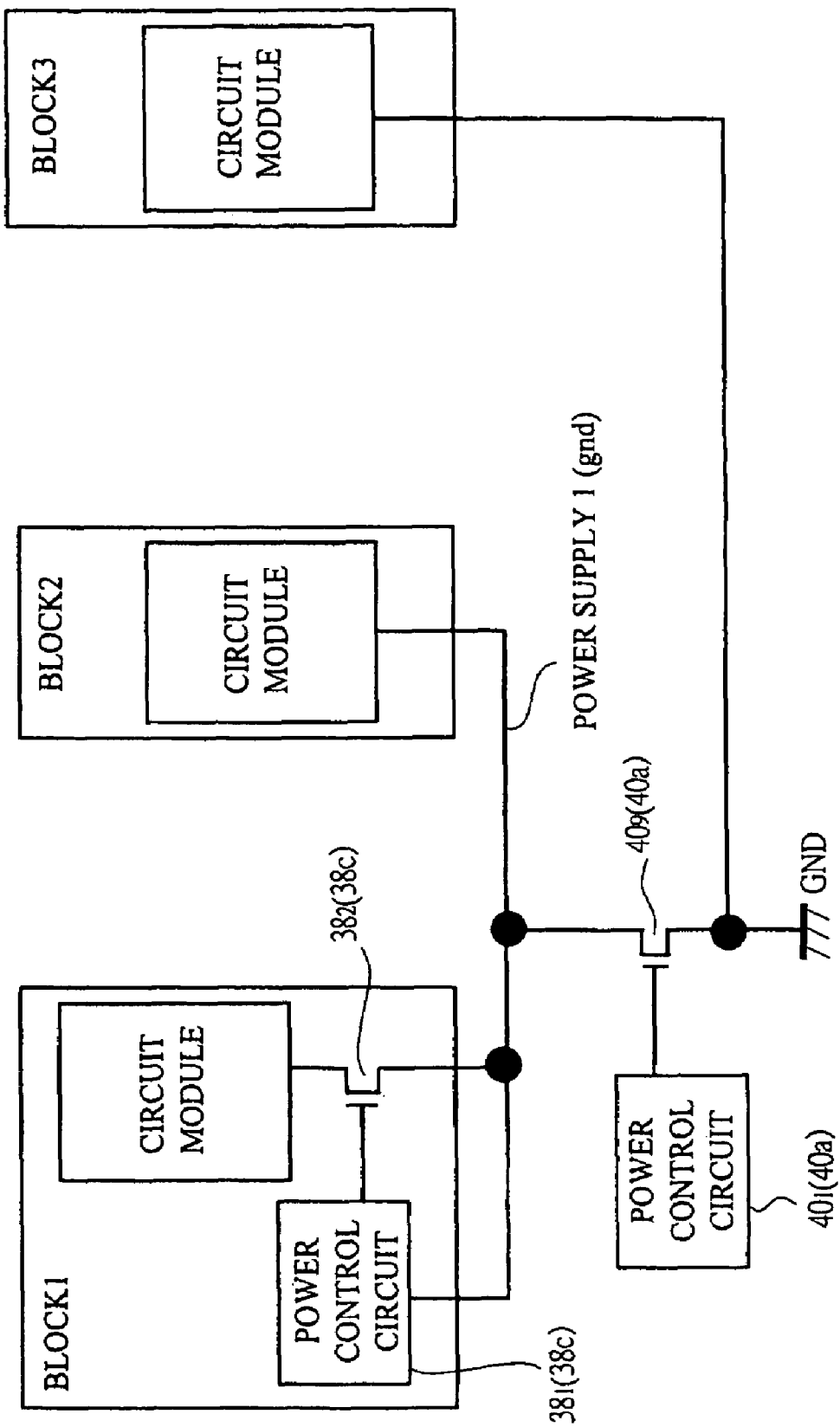
FIG. 7 is a circuit diagram showing the connection configuration of the power control section provided in the semiconductor integrated circuit device according to a fourth embodiment of the present invention.

FIG. 7 is a diagram in the fourth embodiment, in which the second embodiment is applied to the semiconductor integrated circuit device shown in FIG. 1.

Each circuit module constituting a semiconductor integrated circuit device is composed of, for example, an XY memory controller (block 1) 2, a CPU (block 2) 12, and a USB (block 13) 18.

A power control section 38c is composed of the power control circuit $38_1$ and the transistor $38_2$, and in the case where a circuit module in the block 1 becomes a target of the power supply shut off, the transistor $38_2$ is controlled to be turned off by the control signal of a first state from the CPU 12. In this manner, the power supply to the circuit module in the block 1 is shut off.

The power control section 40a is composed of the power control circuit $40_1$ and a transistor (second switch section) $40_9$. The transistor $40_9$ is connected between each circuit module contained in the blocks 1 and 2 and the power control circuit $38_1$ and the reference potential GND, and the Lo signal is outputted from the power control circuit $40_1$ by, for example, the control signal of a second state showing a standby state of the CPU 12 so as to turn off the transistor $40_9$. By doing so, it is possible to control the shut off of the power supply to the blocks 1 and 2. Further, the transistor $40_9$ is not limited to the configuration of FIG. 7 and can be provided by each circuit module and the power control circuit $38_1$ as shown in FIG. 5.

The circuit module contained in the block 3 includes, for example, an interrupt controller 10, communication units 17 and 18, a timer unit (not shown), and the like. These circuits perform the input-output of the signals with the outside of the semiconductor integrated circuit device and never become the targets of the control of the power supply shut off in order to always be in a state ready to receive the signal.

The circuit module contained in the block 1 includes, for example, an XY memory 3, a user memory controller 4, and the like, and in the case where the semiconductor integrated circuit device is in a mode not to access a built-in memory or there is no need to perform the operation for a fixed period of time, it is possible to shut off the power supply by the power control section 38c regardless of the operation of other circuit modules.

The circuit module contained in the block 2 includes, for example, the DSP 13. These blocks share the power control section 40a with other blocks, and in the case where they are in a state not being accessed even in the period when the semiconductor integrated circuit device is in an operating state, it is possible to shut off the power supply by the power control section 40a.

By these controls of the power supply, it is possible to reduce the consumption current at the operation time and the standby time. Further, since the power supply is shut off and the unnecessary operations of the circuit modules are prevented, it is possible to reduce a power supply noise in the semiconductor integrated circuit device.

Further, these blocks can be composed of a plurality of blocks. Further, it is also possible to provide the power control section 38c commonly used by a plurality of circuit modules.

Further, the configuration of the power control circuit is not limited to the above-described embodiments, and the configuration similar to that of the third embodiment in which the power supply control is performed by the NAND circuit (switch control section) and the AND circuit is also available.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor integrated circuit formed on a single chip semiconductor, comprising:
    a central processing unit; and
    an internal memory,
    wherein said central processing unit is operable to access said internal memory,
    wherein said internal memory includes a memory mat, an input/output unit, a control unit, a first power control unit, and a second power control unit,
    wherein said central processing unit is operable to access to said memory mat,
    wherein said input/output unit couples to said memory mat,
    wherein said control unit controls said internal memory,
    wherein said first power control unit couples to said input/output unit, and controls to provide a power supply voltage to said input/output unit,
    wherein said first power control unit controls to turn off a first switch which couples between said input/output unit and a reference potential, for stopping said power supply voltage to said input/output unit when said memory mat is un-selected,
    wherein said second power control unit couples to said control unit and said first power control unit, and controls to provide said power supply voltage to said control unit and said first power control unit, and
    wherein said second power control unit controls to turn off a second switch which couples between said control unit and said reference potential, and a third switch which couples between said first power control unit and said reference potential, for stopping said power supply voltage to said control unit and said first power control unit, after inputting a standby signal from said central processing unit.

2. A semiconductor integrated circuit, according to claim 1,
    wherein said internal memory further includes a second memory mat, a second input/output unit, and a third power control unit, and
    wherein said third power control unit controls to provide said power supply voltage to said second input/output unit.

3. A semiconductor integrated circuit, according to claim 2,
    wherein when said second memory mat is un-selected, said third power control unit controls to turn off a fourth switch which couples between said second input/output unit and said reference potential, for stopping said power supply voltage to said second input/output unit.

4. A semiconductor integrated circuit, according to claim 2,
    wherein when said memory mat is accessed from said central processing unit, said first power control unit controls to provide said power supply voltage to said input/output unit, and said third power control unit controls to turn off a third switch which couples between said second input/output unit and said reference potential, for stopping said power supply voltage to said second input/output unit.

* * * * *